(12) United States Patent
Uehling

(10) Patent No.: US 9,496,212 B2
(45) Date of Patent: Nov. 15, 2016

(54) SUBSTRATE CORE VIA STRUCTURE

(71) Applicant: FREESCALE SEMICONDUCTOR, INC., Austin, TX (US)

(72) Inventor: Trent S. Uehling, New Braunfels, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 62 days.

(21) Appl. No.: 14/576,514

(22) Filed: Dec. 19, 2014

(65) Prior Publication Data

US 2016/0181191 A1 Jun. 23, 2016

(51) Int. Cl.
| | | |
|---|---|---|
| *H05K 1/11* | (2006.01) | |
| *H05K 1/03* | (2006.01) | |
| *H01L 23/48* | (2006.01) | |
| *H01K 3/10* | (2006.01) | |
| *H01L 23/498* | (2006.01) | |
| *H01L 21/48* | (2006.01) | |
| *H01L 21/3105* | (2006.01) | |

(52) U.S. Cl.
CPC ... *H01L 23/49838* (2013.01); *H01L 21/31053* (2013.01); *H01L 21/486* (2013.01); *H01L 23/49827* (2013.01); *H01L 21/4857* (2013.01); *H01L 23/49822* (2013.01); *H01L 2924/0002* (2013.01)

(58) Field of Classification Search
CPC ........... H01L 23/49838; H01L 21/486; H01L 23/49827
USPC ................. 174/255, 262, 264; 257/773, 774; 29/852
See application file for complete search history.

(56) References Cited

U.S. PATENT DOCUMENTS

| | | | | |
|---|---|---|---|---|
| 5,585,675 A | * | 12/1996 | Knopf | H01L 23/481 257/686 |
| 6,271,483 B1 | * | 8/2001 | Horiuchi | H01L 23/49827 174/251 |
| 6,573,595 B1 | | 6/2003 | Chen et al. | |
| 6,992,379 B2 | | 1/2006 | Alcoe | |
| 2007/0045857 A1 | * | 3/2007 | Wark | H01L 21/486 257/773 |

OTHER PUBLICATIONS

"In-House Manufacture of the 'Laminate' High-Density Multilayer Build-up Interposer Substrate", Sony Corporation, http://www.sony.net/Products/SC-HP/cx_news_archives/img/pdf/vol_57/sideview57.pdf, vol. 57, 4 pages, Apr. 20, 2014.
"How are Corrugated Boxes Made" http://www.tappi.org/paperu/all_about_paper/earth_answers/earthanswers_howboxes.pdf, TAPPI—The Leading Technical Association for the Worldwide Pulp, Paper and Convering Industry, pp. 1-6, 2001.

* cited by examiner

*Primary Examiner* — Sherman Ng

(57) ABSTRACT

By now it should be appreciated that there has been provided methods for making a packaged semiconductor device (and the resultant device) including a via layer that includes a top surface and a bottom surface; a plurality of vias within the via layer, wherein the plurality of vias extend from the bottom surface to the top surface; a first via of the plurality of vias extending from the bottom surface to the top surface at a first angle; and a second via of the plurality of vias extending from the bottom surface to the top surface at a second angle.

19 Claims, 7 Drawing Sheets

SUBSTRATE CORE VIA STRUCTURE

BACKGROUND

Field

This disclosure relates generally to semiconductor devices, and more specifically, to forming a core via structure in packaged semiconductor devices.

Related Art

Typical substrate core via structures are fabricated through a serial process that is limited by the time it takes to individually drill and plate each via. In many applications, the processing limitations in creating higher core via counts severely restrict design and price elements.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The use of conductive vias to create connection pathways between different layers within semiconductor device packages is widespread. Vias not only allow for the passage of signals through semiconductor device packages, but also serve to provide power throughout the devices. As semiconductor devices become more complex the need for more vias rises as well. A limiting factor in typical package substrate core via manufacturing processes is the time required to create each individual via. Current methods of manufacturing core via layers may require a process of mechanical or laser drilling and plating for each individual via. Such methods may require long manufacturing times, resulting in limitations on the total via count possible for manufacturing.

The present disclosure provides methods to decrease manufacturing steps and time in forming core via layers by creating multiple vias with a parallel process. The concurrent formation of core vias through corrugation method eliminates the need to serially undergo multiple fabrication steps for each core via, allowing for shorter manufacturing time as well as more diverse core via configurations.

Figure 1:
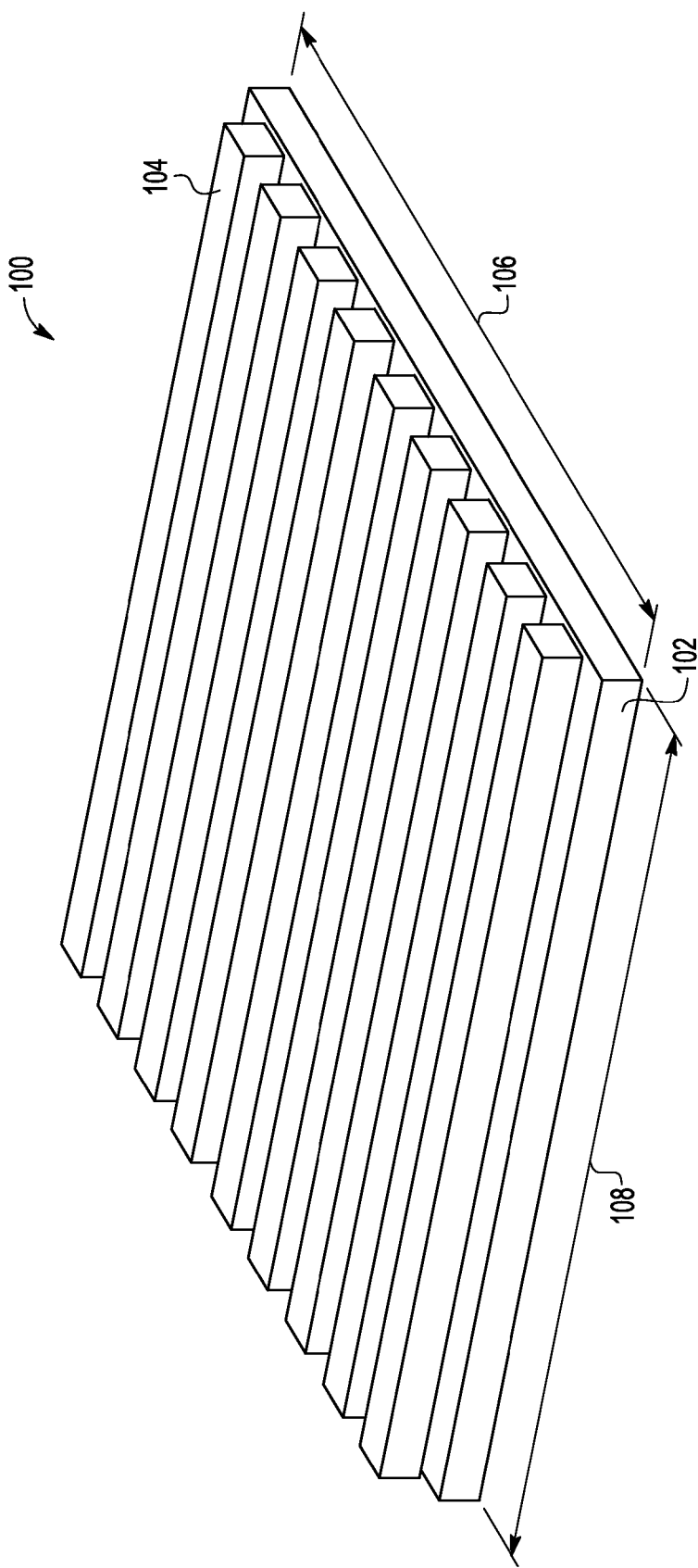
FIG. 1 illustrates an example semiconductor structure including a plurality of electrically conductive lines formed over electrically non-conductive base layer, in accordance with certain embodiments of the present disclosure.

FIG. 1 illustrates an example semiconductor structure 100 including a plurality of electrically conductive lines 104 formed over electrically non-conductive base layer 102, in accordance with certain embodiments of the present disclosure. In some embodiments, semiconductor structure 100 may include any number of electrically conductive lines 104 formed over electrically non-conductive base layer 102. In the same or alternative embodiments, conductive lines 104 may be in any appropriate configuration relative one another. That is, conductive lines 104 may be arranged in any appropriate configuration that may result in the formation of a plurality of core vias of the desired dimensions, angle, cross-section, and/or other parameter, as described in more detail below with reference to FIGS. 2-8. For example, some or all of electrically conductive lines 104 may be substantially parallel to one another, as illustrated in FIG. 1. In the same or alternative configurations, one or more of conductive lines 104 may be at other angles to one another, as described in more detail below with reference to FIG. 2.

To aid in understanding, FIG. 1 also illustrates a first dimension 106 and a second dimension 108. In some embodiments, first dimension 106 may be considered as substantially perpendicular to a given electrically conductive line 104. Because FIG. 1 illustrates a plurality of electrically conductive lines 104 that are substantially parallel to one another, first dimension 106 may be substantially the same for all substantially parallel electrically conductive lines 104. In the same or alternative embodiments, first dimension 106 may vary in orientation between or among one or more electrically conductive lines 104. Similarly, second dimension 108 may be considered as substantially parallel to a given electrically conductive line 104. Because FIG. 1 illustrates a plurality of electrically conductive lines 104 that are substantially parallel to one another, second dimension 108 may be substantially the same for all substantially parallel electrically conductive lines 104. In the same or alternative embodiments, second dimension 108 may vary in orientation between or among one or more electrically conductive lines 104.

In some embodiments, electrically conductive lines 104 may be formed from any conductive material appropriate for the formation of core vias, e.g., copper. In the same or alternative embodiments, non-conductive base layer 102 may be made of any appropriate non-conductive layer operable to support electrically conductive lines 104 in the core via manufacturing process, e.g., glass-filled epoxy resin.

Figure 3:
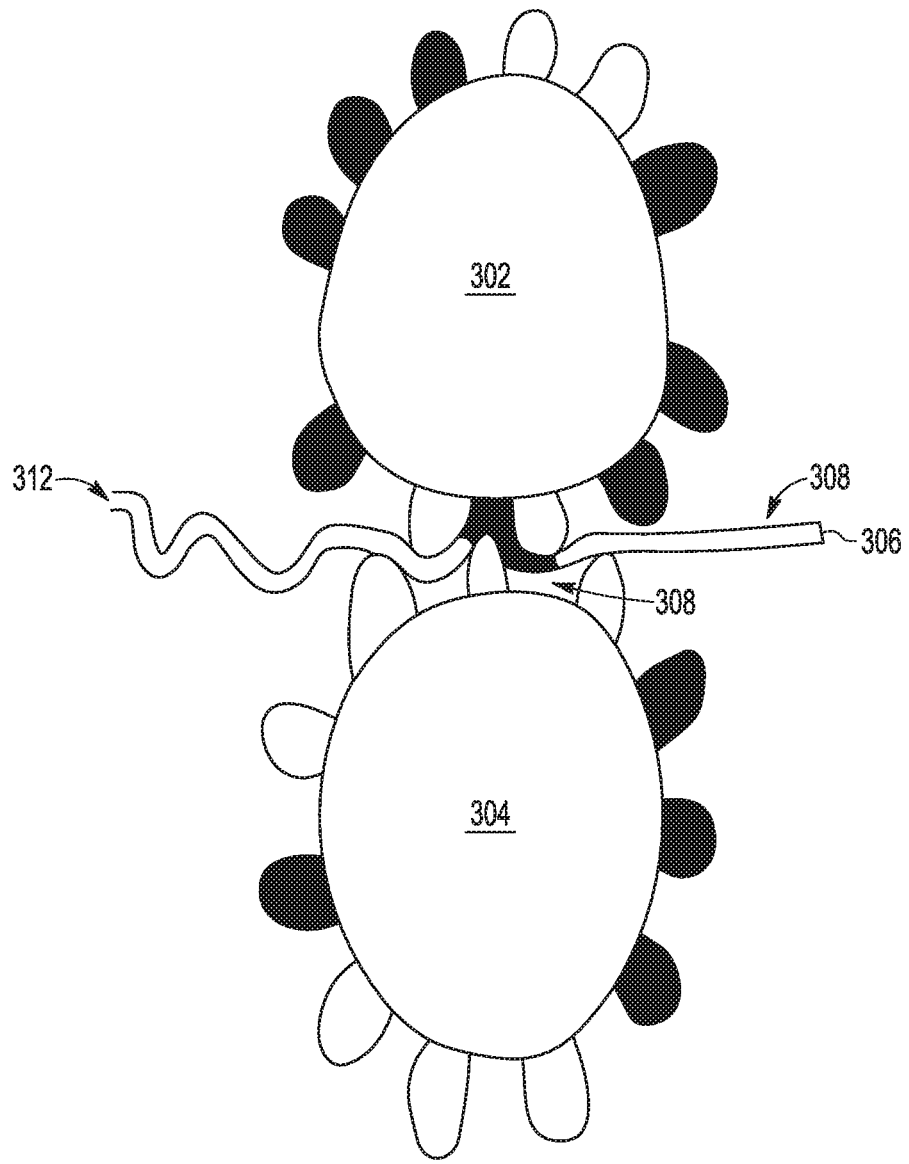
FIG. 3 illustrates an example configuration for shaping one or more of the plurality of electrically conductive lines into one or more fillable structures, in accordance with certain embodiments of the present disclosure.

In some embodiments, electrically conductive lines 104 may be laminated with a non-conductive material prior to shaping electrically conductive lines 104 into a plurality of core vias, as described in more detail below with reference to FIGS. 3-4. The laminate material may include any appropriate material, including expoxy, resin, cured epoxy-resin synthetic, glass fiber substrate, and/or a paper fiber material.

In some embodiments, electrically conductive lines 104 may be formed, each having a cross-section that may be the same or different from each of the other electrically conductive lines 104. In the same or alternative embodiments, one group of electrically conductive lines 104 may have substantially the same shape of cross-section while another group of electrically conductive lines 104 may have a different shape of cross-section. Further, a given electrically conductive line 104 may be formed having a plurality of cross-section shapes along a given length of electrically conductive line 104. The shape of any given cross-section may be any shape necessary or desirable to form the appropriate core via shape. For example, a given electrically conductive line 104 may have a cross-section that is substantially: circular, square, triangular, quadrilateral, hexagonal, and/or rectangular.

Figure 2:
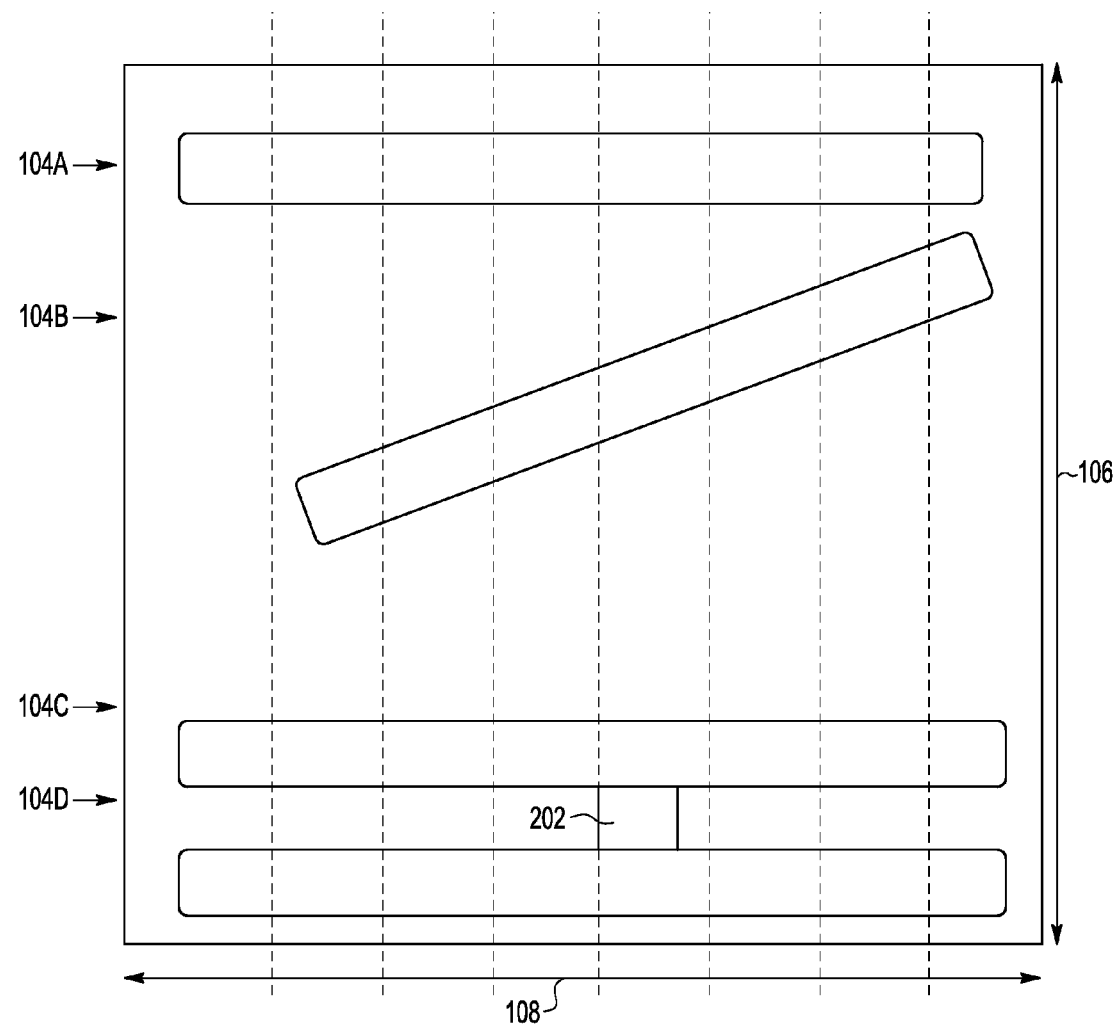
FIG. 2 illustrates an example semiconductor structure including a plurality of electrically conductive lines formed over electrically non-conductive base layer, in accordance with certain embodiments of the present disclosure.

As described in more detail above, the plurality of electrically conductive lines 104 may be oriented at different angles from one another. FIG. 2 illustrates an example semiconductor structure 100 including a plurality of electrically conductive lines 104A, 1048, 104C, 104D formed over electrically non-conductive base layer 102, in accordance with certain embodiments of the present disclosure. In some embodiments, semiconductor structure 100 may include any number of electrically conductive lines 104 formed over electrically non-conductive base layer 102. In the same or alternative embodiments, conductive lines 104 may be in any appropriate configuration relative one another. That is, conductive lines 104 may be arranged in any appropriate configuration that may result in the formation of a plurality of core vias of the desired dimensions, angle, cross-section, and/or other parameter, as described in more detail below with reference to FIGS. 3-8. For example, some or all of electrically conductive lines 104 may be substantially parallel to one another (e.g., electrically conductive lines 104C, 104D), and/or one or more of conductive lines 104 may be at other angles to one another (e.g., electrically conductive lines 104A, 104B).

In some embodiments, semiconductor structure 100 may also include one or more electrically conductive lines 202 electrically coupling a plurality of electrically conductive lines 104. Electrically conductive lines 202 may be formed into lateral conductive elements between or among a plurality of core vias, as described in more detail below with reference to FIGS. 3, 6.

To aid in understanding, FIG. 2 also illustrates a first dimension 106 and a second dimension 108. In some embodiments, first dimension 106 may be considered as substantially perpendicular to a given electrically conductive line 104. In some embodiments, first dimension 106 may vary in orientation between or among one or more electrically conductive lines 104. For example, first dimension 106A and first dimension 1068 differ from one another and from first dimensions 106C, 106D, while first dimensions 106C, 106D may be substantially similar to one another. Similarly, second dimension 108 may be considered as substantially parallel to a given electrically conductive line 104. In some embodiments, second dimension 108 may vary in orientation between or among one or more electrically conductive lines 104.

In some embodiments, electrically conductive lines 104 may be formed from any conductive material appropriate for the formation of core vias, e.g., copper. In the same or alternative embodiments, non-conductive base layer 102 may be made of any appropriate non-conductive layer operable to support electrically conductive lines 104 in the core via manufacturing process, e.g., glass-filled epoxy resin.

In some embodiments, electrically conductive lines 104 may be laminated with a non-conductive material prior to shaping electrically conductive lines 104 into a plurality of core vias, as described in more detail below with reference to FIGS. 3-4. The laminate material may include any appropriate material, including epoxy, resin, cured epoxy-resin synthetic, glass fiber substrate, and/or a paper fiber material.

In some embodiments, electrically conductive lines 104 may be formed, each having a cross-section that may be the same or different from each of the other electrically conductive lines 104. In the same or alternative embodiments, one group of electrically conductive lines 104 may have substantially the same shape of cross-section while another group of electrically conductive liens 104 may have a different shape of cross-section. Further, a given electrically conductive line 104 may be formed having a plurality of cross-section shapes along a given length of electrically conductive line 104. The shape of any given cross-section may be any shape necessary or desirable to form the appropriate core via shape. For example, a given electrically conductive line 104 may have a cross-section that is substantially: circular, square, triangular, quadrilateral, hexagonal, and/or rectangular.

Shaping the plurality of electrically conductive lines 104 illustrated in FIGS. 1-2 may make use of any appropriate shaping mechanism operable to shape each electrically conductive line 104 formed over base layer 102 into a plurality of fillable structures, as described in more detail below. FIG. 3 illustrates an example configuration 300 for shaping one or more of the plurality of electrically conductive lines 104 formed over base layer 102 into one or more fillable structures, in accordance with certain embodiments of the present disclosure. Configuration 300 may include a plurality of roller 302, 304 operable to corrugate one or more electrically conductive lines 104 formed over base layer 102 into a desired shape, as described in more detail below with reference to FIG. 4. Example configuration 300 may include an electrically conductive line on base layer structure 306 fed between rollers 302, 304. Electrically conductive line on base layer structure 306 is depicted as an example only, and may be substantially equivalent to electrically conductive line 104A, 1046, 104C, 104D, and/or other electrically conductive line 104 formed over base layer 102. Although example configuration 300 illustrates two roller 302, 304 subjecting electrically conductive line 306 to a corrugation process, other configurations may use other appropriate shaping techniques for shaping electrically conductive line 306 without departing from the scope of the present disclosure. For example, more, fewer, or different numbers, types, and/or shapes of rollers may be used in a corrugation process, as described in more detail below with reference to FIG. 7. As an additional example, other shaping processes such as stamping, cutting, or other shaping processes may be used without departing from the scope of the present disclosure.

In some embodiments, electrically conductive line over base layer structure 306 may include unshaped portion 308, shaped portion 312, and shaping portion 310. Unshaped portion 308 may include any portion of electrically conductive line on base layer structure 306 not yet undergoing a shaping process, shaping portion 310 may include any portion of electrically conductive line on base layer structure 306 currently undergoing the shaping process, and shaped portion 312 may include any portion of electrically conductive line on base layer structure 306 that has completed the shaping process.

Depending on the desired shape and/or arrangement of core vias in the final packaged semiconductor device, the shaping process may be used on electrically conductive line on base layer structure 306 in a variety of ways. For example, the shaping process (e.g., example configuration 300) may be implemented in one or more dimensions along electrically conductive line on base layer structure 306 (e.g., first dimension 106 and/or second dimension 108). Further, as described in more detail below with reference to FIG. 6, the shape and/or configuration of a shaping material (e.g., rollers 302, 304) may be varied in order to achieve the desired shape for the resultant core via.

Shaped portion 312 may next be filled with a non-conductive material in order to create the remainder of a via layer to be incorporated into a finished packaged semiconductor device. FIG. 4 illustrates an example filled, shaped semiconductor structure 400, in accordance with certain embodiments of the present disclosure. Semiconductor structure 400 may include a plurality of electrically conductive lines 104 that have been shaped (e.g., by example configuration 300) and the resultant fillable structures 406 filled with a non-conductive material 408.

Figure 4:
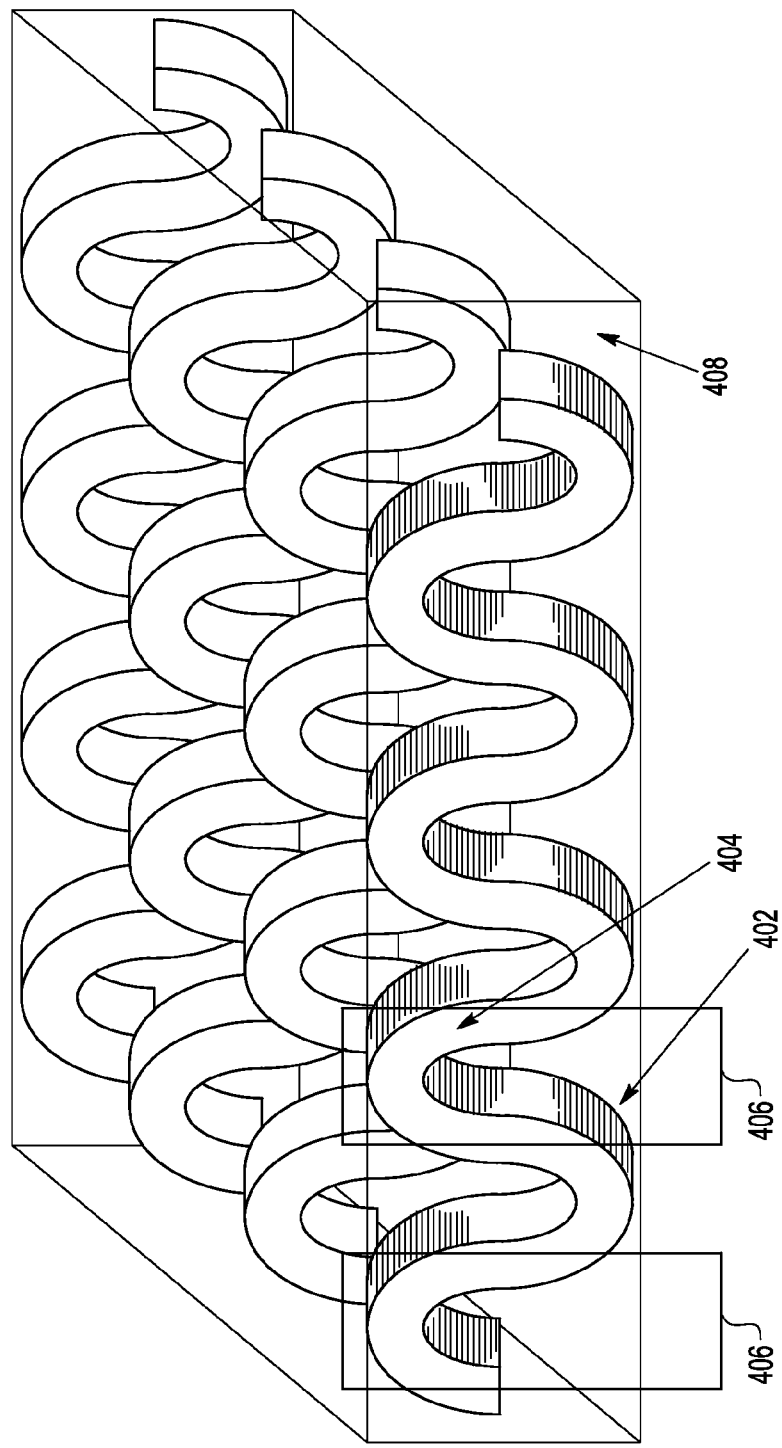
FIG. 4 illustrates an example filled, shaped semiconductor structure, in accordance with certain embodiments of the present disclosure.

FIG. 4 illustrates a semiconductor structure 400 that generally corresponds with semiconductor structure 100 as illustrated in FIG. 1 having undergone a shaping process via example configuration 300 along dimension 108. One of ordinary skill in the art would recognize that other semiconductor structures 400 would be achievable without departing from the scope of the present disclosure. For example, the angles comprising each fillable structure 406 may vary, as described in more detail below with reference to FIGS. 5-8, the angles between or among one or more electrically conductive lines 104 may vary, as described in more detail above with reference to FIGS. 1-2, and other parameters of electrically conductive lines 104 and/or fillable structures 406 may vary according to the desired shape and/or other properties of the resultant core vias.

Semiconductor structure 400 may include a plurality of fillable structures 406 filled with a non-conductive material 408. In some embodiments, each fillable structure may include a top portion 404 and a bottom portion 402. In some embodiments, neighboring fillable structures 406 may share some portion of bottom portion 402 and/or top portion 404 as a result of the shaping process. Once the plurality of electrically conductive lines 104 have been shaped, and the resultant fillable structures 406 filled, semiconductor structure 400 may then undergo a grinding process.

Figure 5:
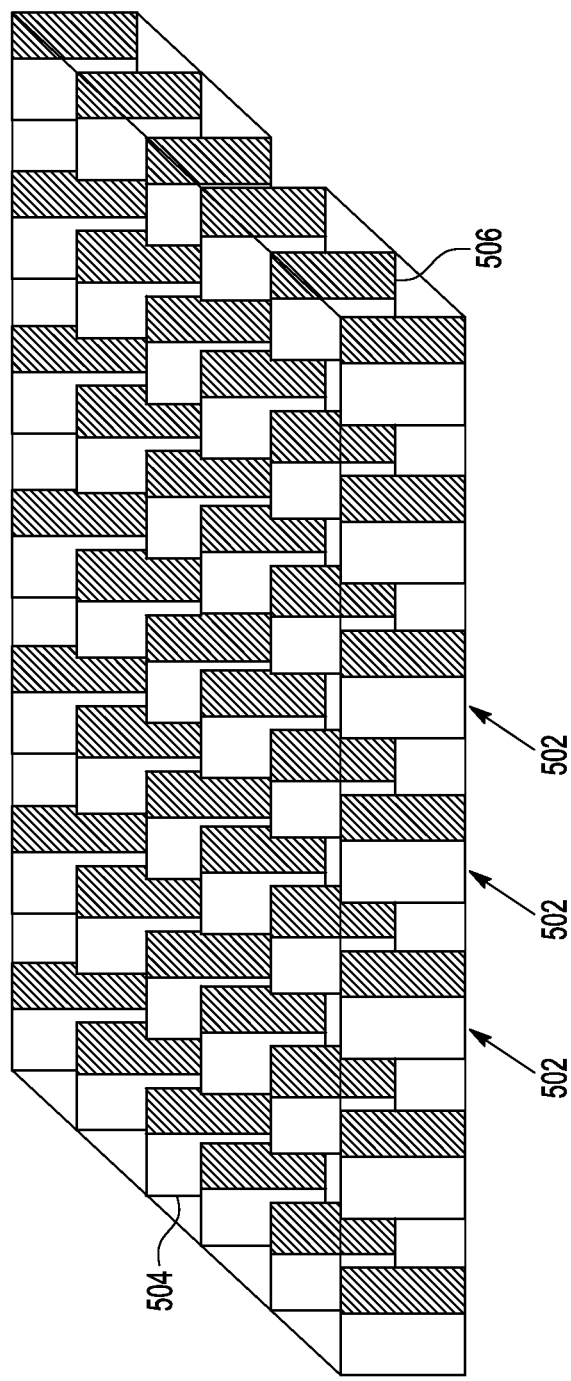
FIG. 5 illustrates an example via layer, in accordance with certain embodiments of the present disclosure.

FIG. 5 illustrates an example via layer 500, in accordance with certain embodiments of the present disclosure. Via layer 500 may include a plurality of vias 502 formed from a grinding process applied to a plurality of fillable structure 406 and non-conductive material 408 (e.g., semiconductor structure 400). By grinding at least a portion of non-conductive material 408, as well as some or all of top portion 404 and bottom portion 402, vias 502 may be formed extending from a top surface 504 of via layer 500 to a bottom surface 506 of via layer 500. In some embodiments, the grinding process may be any appropriate grinding process operable to grind at least a portion of non-conductive material 408, as well as some or all of top portion 404 and bottom portion 402. For example, the grinding process may be a chemical, physical, mechanical, and/or chemical-mechanical polishing process.

Figure 6:
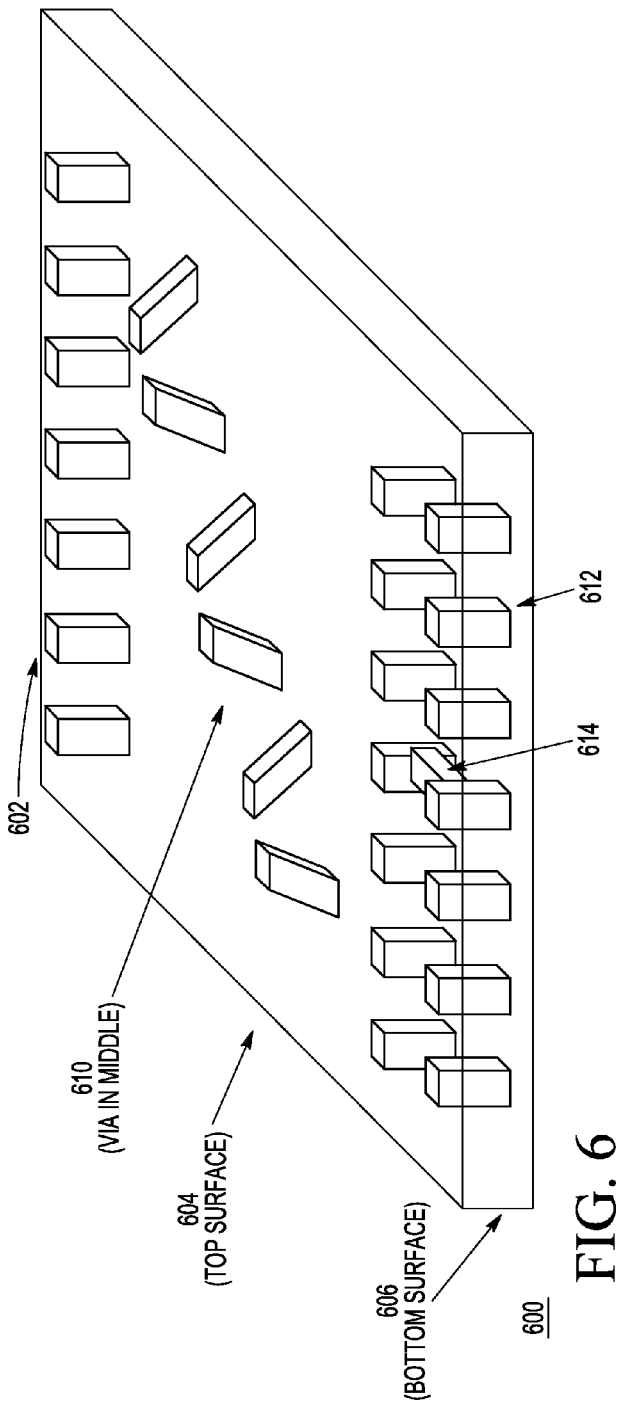
FIG. 6 illustrates another example via layer, in accordance with certain embodiments of the present disclosure.

FIG. 5 illustrates a via layer 500 that generally corresponds with semiconductor structure 100 as illustrated in FIG. 1 having undergone a shaping process via example configuration 300 along dimension 108 as well as a grinding process. One of ordinary skill in the art would recognize that other via layers 500 would be achievable without departing from the scope of the present disclosure. For example, the angles at which each via 502 extends from top surface 504 to bottom surface 506 may vary, as described in more detail below with reference to FIGS. 6-8, the angles between or among one or more vias 502 may vary, as described in more detail above with reference to FIGS. 1-2, and other parameters of electrically conductive lines 104 and/or vias 502 may vary according to the desired design parameters FIG. 6 illustrates an example via layer 600, in accordance with certain embodiments of the present disclosure. Via layer 600 may include a plurality of vias 602, 610, 612 formed from a grinding process applied to a plurality of fillable structure 406 and non-conductive material 408 (e.g., semiconductor structure 400). By grinding at least a portion of non-conductive material 408, as well as some or all of top portion 404 and bottom portion 402, vias 602 may be formed extending from a top surface 604 of via layer 600 to a bottom surface 606 of via layer 600. In some embodiments, the grinding process may be any appropriate grinding process operable to grind at least a portion of non-conductive material 408, as well as some or all of top portion 404 and bottom portion 402. For example, the grinding process may be a chemical, physical, mechanical, and/or chemical-mechanical polishing process.

FIG. 6 illustrates a via layer 600 that generally corresponds with semiconductor structure 100 as illustrated in FIG. 2 having undergone one or more shaping processes that may include one or more example configurations 300 along dimension 108 as well as a grinding process. One of ordinary skill in the art would recognize that other via layers 600 would be achievable without departing from the scope of the present disclosure. For example, the angles at which each via 602 extends from top surface 604 to bottom surface 606 may vary, as described in more detail below with reference to FIGS. 7-8, the angles between or among one or more vias 602 may vary, as described in more detail above with reference to FIGS. 1-2, and other parameters of electrically conductive lines 104 and/or vias 602 may vary according to the desired design parameters.

For example, referring again to FIG. 6, vias 602 may have a different angle from top surface 604 to bottom surface 606 than do vias 610, 612. Further, in some embodiments, via layer 600 may include one or more lateral conductive elements 614 between a plurality of electrically conductive lines 106 formed into vias 602, 610, 612.

The angle taken by any given via between top surface 604 and bottom surface 606 may, in some embodiments, be controlled by a shape of a shaping mechanism (e.g., rollers 302, 304 of example configuration 300).

Figure 7:
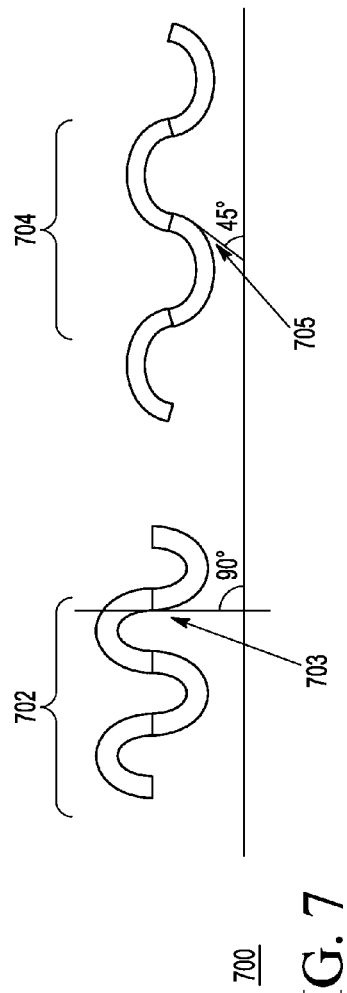
FIG. 7 illustrates a plurality of shaped structures formed from differently-shaped shaping mechanism, resulting in vias of differing angles, in accordance with certain embodiments of the present disclosure.

FIG. 7 illustrates a plurality of shaped structures 702, 704 formed from differently-shaped shaping mechanism, resulting in vias of differing angles, in accordance with certain embodiments of the present disclosure. Shaped structure 702 includes a plurality of fillable structures formed by a shaping mechanism of a first shape. The shape of the shaping mechanism results in a shaped structure having at least one fillable structure with a substantially vertical wall portion 703. Shaped structure 704 includes a plurality of fillable structures formed by a shaping mechanism of a second shape. The shape of the shaping mechanism results in a shaped structure having at least one fillable structure with an acute wall portion 705. In the illustrated example structure 704, the acute wall portion forms a 45-degree angle with the horizontal. In some embodiments, this angle may be more or less, depending on the desired design characteristics of the resultant via.

Figure 8:
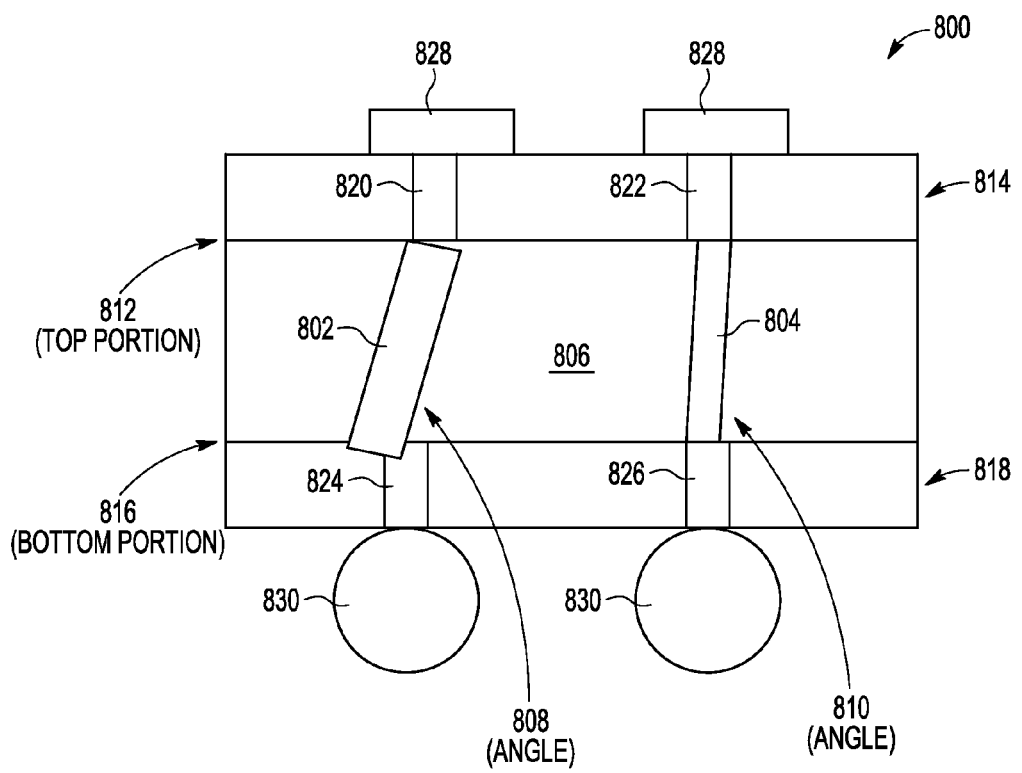
FIG. 8 illustrates a semiconductor device package substrate, in accordance with certain embodiments of the present disclosure.

Once the via layer has been formed, it may be incorporated into a packaged semiconductor device. FIG. 8 illustrates a semiconductor device package substrate 800, in accordance with certain embodiments of the present disclosure. Semiconductor device package substrate 800 may include one or more vias 802, 804 within via layer 806. In some embodiments, via 802 may make an angle 808 within via layer 806 with a layer below via layer 806. Similarly, via 804 may make an angle 810 within via layer 806 with a layer below via layer 806. In some embodiments, angles 808, 810 may be the same and/or different.

In some embodiments, semiconductor device package substrate 800 may also include a plurality of patterned metal layers coupled to via layer 806. This may include a first patterned metal layer 814 in contact with a top portion 812 of via layer 806, as well as a second patterned metal layer 818 in contact with a bottom portion 816 of via layer 806. First and second patterend metal layers 814, 818 may include a plurality of openings 820, 822, 824, 826 through which electrical contact with vias 802, 804 may be made through layers 814, 818. These openings may allow electrical contact to be made through semiconductor device package substrate 800. For example, semiconductor device package substrate 800 may include one or more conductive pads 828 electrically coupled to openings 820, 822, as well as conductive connections 830 (e.g., solder balls) electrically coupled to openings 824, 826. In such a way, electrical connection may be made through semiconductor device package substrate 800.

By now it should be appreciated that there has been provided methods for making a semiconductor device package substrate [800] (and the resultant device) including a via layer [804] that includes a top surface [812] and a bottom surface [816]; a plurality of vias [802, 804] within the via layer, wherein the plurality of vias extend from the bottom surface to the top surface; a first via of the plurality of vias extending from the bottom surface to the top surface at a first angle [808]; and a second via of the plurality of vias extending from the bottom surface to the top surface at a second angle [810].

The method may include forming a plurality of electrically conductive lines [104] over an electrically non-conductive base layer [102], shaping the plurality of electrically conductive lines through a plurality of rollers [302, 304] along a dimension substantially parallel [108] and/or substantially perpendicular [106] to at least one of the plurality of electrically conductive lines to form a plurality of fillable structures [406], filling the plurality of fillable structures with an electrically nonconductive material [408], and grinding the electrically nonconductive material and at least one of the plurality of fillable structures to a top surface [504] and a bottom surface [506] to form a plurality of vias [502, 602, 802, 804], wherein at least one of the plurality of vias extends from the top surface to the bottom surface. The plurality of vias may include a first via extending from the top surface to the bottom surface at a first angle and a second via extending from the top surface to the bottom surface at a second angle.

In some embodiments, the method may also include laminating a portion of the plurality of electrically conductive lines before shaping the plurality of electrically conductive lines. Laminating the portion of the plurality of electrically conductive lines may be done with one of a group consisting of: epoxy, resin, cured epoxy-resin synthetic, glass fiber substrate, or paper fiber material.

In some embodiments, at least one of the plurality of electrically conductive lines may have a cross-section of one of a group consisting of: circular, square, triangular, quadrilateral, hexagonal, or rectangular cross-section.

In some embodiments, grinding the electrically nonconductive material may be done through one of a group consisting of: chemical, physical, mechanical, or chemical-mechanical polishing processes.

In some embodiments, shaping the plurality of conductive lines may include shaping a first conductive line through a plurality of rollers of a first shape and shaping a second conductive line through a plurality of rollers of a second shape.

Because the apparatus implementing the present invention is, for the most part, composed of electronic components and circuits known to those skilled in the art, circuit details and known processing steps will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim may include the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a packaged semiconductor structure, the method comprising:
    forming a plurality of electrically conductive lines over an electrically non-conductive base layer;
    shaping the plurality of electrically conductive lines through a plurality of rollers along a dimension substantially parallel to at least one of the plurality of electrically conductive lines to form a plurality of fillable structures;

filling the plurality of fillable structures with an electrically nonconductive material; and grinding the electrically nonconductive material and at least one of the plurality of fillable structures to a top surface and a bottom surface to form a plurality of vias, wherein at least one of the plurality of vias extends from the top surface to the bottom surface.

2. The method of claim 1, further comprising:

laminating a portion of the plurality of electrically conductive lines before shaping the plurality of electrically conductive lines.

3. The method of claim 2, wherein laminating the portion of the plurality of electrically conductive lines is done with one of a group consisting of: epoxy, resin, synthetic epoxy-resin, glass fiber substrate, or paper fiber material.

4. The method of claim 1, wherein at least one of the plurality of electrically conductive lines has a cross-section of one of a group consisting of: circular, square, triangular, quadrilateral, hexagonal, or rectangular cross-section.

5. The method of claim 1, wherein grinding the electrically nonconductive material is done through one of a group consisting of: chemical, physical, mechanical, or chemical-mechanical polishing processes.

6. The method of claim 1, wherein shaping the plurality of conductive lines comprises shaping a first conductive line through a plurality of rollers of a first shape and shaping a second conductive line through a plurality of rollers of a second shape.

7. The method of claim 1, wherein the plurality of vias comprises a first via extending from the top surface to the bottom surface at a first angle and a second via extending from the top surface to the bottom surface at a second angle.

8. A method of making a packaged semiconductor structure, the method comprising:

forming a plurality of electrically conductive lines over an electrically non-conductive base layer;

shaping the plurality of electrically conductive lines through a plurality of rollers along a dimension substantially perpendicular to at least one of the plurality of electrically conductive lines to form a plurality of fillable structures;

filling the plurality of fillable structures with a nonconductive material; and grinding the nonconductive material and at least one of the plurality of fillable structures to a top surface and a bottom surface to form a plurality of vias, wherein at least one of the plurality of vias extends from the top surface to the bottom surface.

9. The method of claim 8, further comprising:

laminating a portion of the plurality of electrically conductive lines before shaping the plurality of electrically conductive lines.

10. The method of claim 8, wherein laminating the plurality of electrically conductive lines is done with one of a group consisting of: epoxy, resin, cured epoxy-resin synthetic, glass fiber substrate, or paper fiber material.

11. The method of claim 8, wherein at least one of the plurality of electrically conductive lines has a cross-section of one of a group consisting of: circular, square, triangular, quadrilateral, hexagonal, or rectangular cross-section.

12. The method of claim 8, wherein grinding the nonconductive material is done through one of a group consisting of: chemical, physical, mechanical, or chemical-mechanical polishing processes.

13. The method of claim 8, wherein shaping the plurality of conductive lines comprises shaping a first conductive line through a plurality of rollers of a first shape and shaping a second conductive line through a plurality of rollers of a second shape.

14. The method of claim 9, wherein the plurality of vias comprises a first via extending from the top surface to the bottom surface at a first angle and a second via extending from the top surface to the bottom surface at a second angle.

15. A packaged semiconductor structure, the structure comprising:

a via layer comprising a top surface and a bottom surface;

a plurality of vias within the via layer, wherein the plurality of vias extend from the bottom surface to the top surface;

a first via of the plurality of vias extending from the bottom surface to the top surface at a first angle; and a second via of the plurality of vias extending from the bottom surface to the top surface at a second angle;

wherein the first angle is associated with a structure of a first corrugating element and the second angle is associated with a structure of a second corrugating element.

16. The packaged semiconductor structure of claim 15, wherein a portion of the plurality of vias has a cross-section of one of a group consisting of:

circular, square, triangular, quadrilateral, hexagonal, or rectangular cross-section.

17. The packaged semiconductor structure of claim 15, wherein the first angle is equal to the second angle.

18. The packaged semiconductor structure of claim 15, wherein the first angle is different from the second angle.

19. The packaged semiconductor structure of claim 15, wherein the first via has a cross-section of a first shape and the second via has a cross-section of a second shape.

* * * * *